United States Patent
Huang

(10) Patent No.: US 8,614,583 B2
(45) Date of Patent: Dec. 24, 2013

(54) VOLTAGE DETECTION CIRCUIT

(75) Inventor: Yong-Zhao Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 400 days.

(21) Appl. No.: 12/970,963

(22) Filed: Dec. 17, 2010

(65) Prior Publication Data

US 2012/0139526 A1    Jun. 7, 2012

(30) Foreign Application Priority Data

Jun. 12, 2010 (CN) .................. 2010 1 0574892.8

(51) Int. Cl.
*G01R 19/00* (2006.01)
(52) U.S. Cl.
USPC .............. 324/522; 324/762.01; 361/91.5; 361/91.6
(58) Field of Classification Search
USPC .............. 324/307, 542, 556, 762.01, 762.07, 324/762.08, 762.09, 764.01; 361/91.5, 91.6
See application file for complete search history.

(56) References Cited

U.S. PATENT DOCUMENTS

| | | | | |
|---|---|---|---|---|
| 4,558,226 A * | 12/1985 | Takada et al. | ................. | 250/551 |
| 6,121,767 A * | 9/2000 | Havel | ............................. | 324/115 |
| 6,275,011 B1 * | 8/2001 | Yang | ............................. | 320/150 |
| 6,466,029 B2 * | 10/2002 | Stroth et al. | .................. | 324/509 |
| 8,410,705 B2 * | 4/2013 | Bollmann et al. | ............. | 315/119 |
| 8,415,892 B2 * | 4/2013 | Yang | ............................. | 315/224 |
| 2005/0168162 A1 * | 8/2005 | Inoue | ............................. | 315/225 |
| 2009/0021871 A1 * | 1/2009 | Moran et al. | .................... | 361/15 |
| 2010/0123399 A1 * | 5/2010 | Bollmann et al. | ............. | 315/122 |

OTHER PUBLICATIONS

Stan Gibilisco, Illustrated Dictionary of Electronics, McGraw-Hill, eBook 8th ed., 2001, p. 652.*

* cited by examiner

*Primary Examiner* — Huy Q Phan
*Assistant Examiner* — Robert P Alejnikov, Jr.
(74) *Attorney, Agent, or Firm* — Altis Law Group, Inc.

(57) ABSTRACT

A voltage detection circuit used to detect a voltage source includes a Zener diode, a thyristor, a first resistor, a second resistor, a first light-emitting diode (LED), and a second LED. A cathode of the Zener diode is connected to the voltage source. An anode of the Zener diode is connected to a control terminal of the thyristor through a first resistor. An anode of the thyristor is connected to the voltage source through a second resistor. The anode of the thyristor is connected to an anode of the first LED. A cathode of the thyristor is connected to a cathode of the first LED. The cathode of the thyristor is connected to an anode of the second LED, and a cathode of the second LED is grounded.

3 Claims, 1 Drawing Sheet

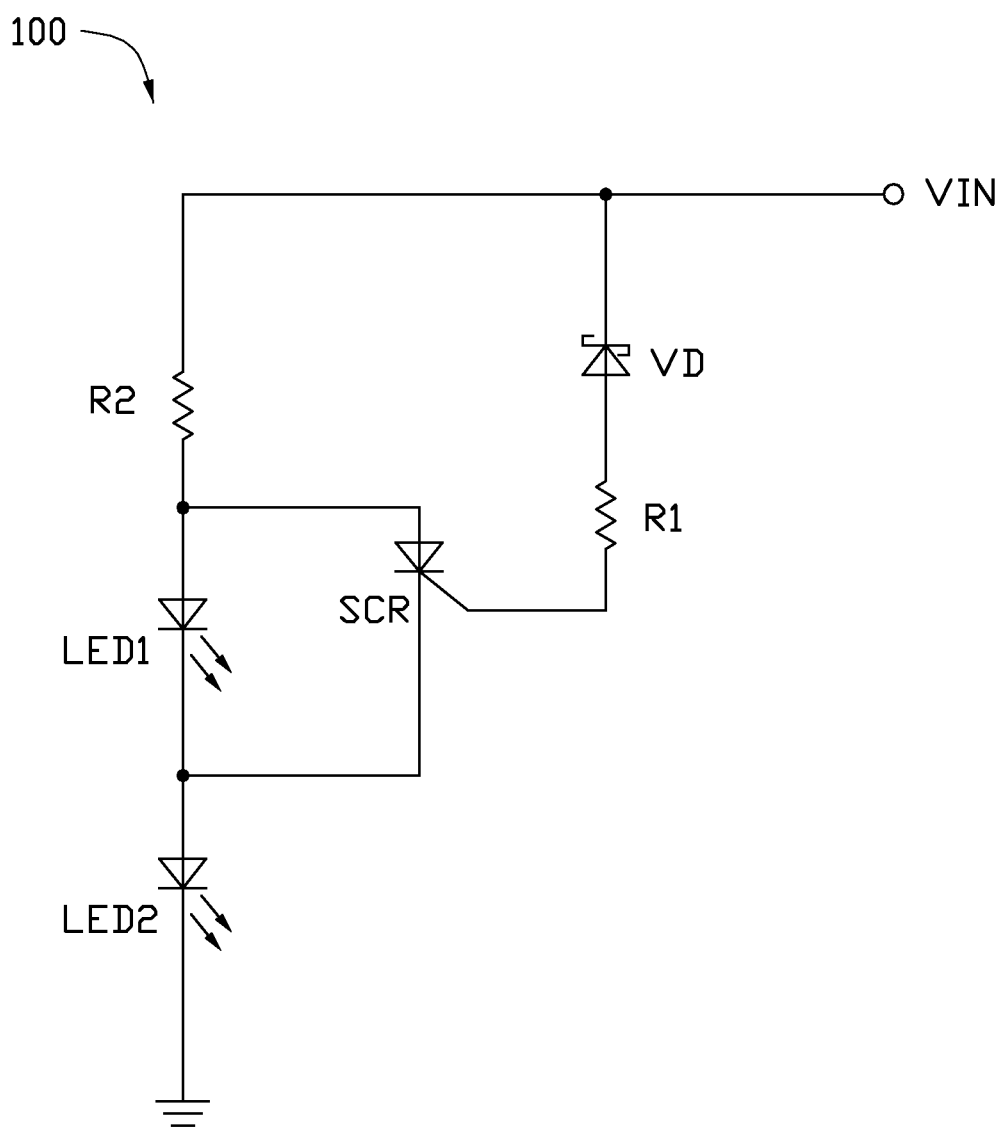

VOLTAGE DETECTION CIRCUIT

BACKGROUND

1. Technical Field

The present disclosure relates to a voltage detection circuit.

2. Description of Related Art

When a power supply unit, such as a battery of a computer motherboard, cannot supply enough voltage to the computer motherboard, the computer motherboard may not work normally. Therefore, a voltage detecting circuit for detecting voltage level is needed.

BRIEF DESCRIPTION OF THE DRAWING

Many aspects of the present embodiments can be better understood with reference to the following drawing. The components in the drawings are not necessarily drawn to scale, the emphasis instead being placed upon clearly illustrating the principles of the present embodiments.

The drawing is a circuit diagram of an embodiment of a voltage detection circuit.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Referring to the drawing, an embodiment of a voltage detection circuit 100 is used to detect a voltage source VIN of an electronic device. The voltage detecting circuit 100 includes a Zener diode VD, a thyristor SCR, a first light-emitting diode LED1 (hereinafter first diode LED1), a second light-emitting diode LED2 (hereinafter second diode LED2), and two resistors R1 and R2.

A cathode of the Zener diode VD is connected to the voltage source VIN. An anode of the Zener diode VD is connected to a control terminal of the thyristor SCR through the resistor R1. An anode of the thyristor SCR is connected to an anode of the first diode LED1, and connected to the voltage source VIN through the resistor R2. A cathode of the thyristor SCR is connected to a cathode of the first diode LED1 and connected to an anode of the second diode LED2. A cathode of the second diode LED2 is grounded. In one embodiment, the first and second diodes LED1 and LED2 respectively emit different-colored light, and respectively have turn-on voltages V1 and V2. A breakdown voltage of the Zener diode VD is $V_{VD}$. In one embodiment, $V1+V2<V_{VD}$.

In use, when the voltage Vin of the voltage source VIN is greater than the breakdown voltage $V_{VD}$ of the Zener diode VD, namely $Vin>V_{VD}$, the thyristor SCR is turned on, therefore the second diode LED2 is turned on, and the first diode LED1 is turned off. At this time, the first diode LED1 does not light up, but the second diode LED2 lights up, which means the voltage Vin of the voltage source VIN is greater than the maximum value of a required voltage range.

When $V1+V2<Vin<V_{VD}$, the thyristor SCR is turned off, therefore the first diode LED1 and the second diode LED2 are turned on. At this time, the first diode LED1 and the second diode LED2 both light up, which means the voltage Vin of the voltage source VIN is in the require voltage range.

When $V1<Vin<V1+V2$, the first diode LED1 is turned on, the second diode LED2 is turned off. At this time, the first diode LED1 lights up and the second diode LED2 does not light up, which means the voltage Vin of the voltage source VIN is less than the minimum value of the required voltage range but in a warning voltage range, therefore the electronic device may only work for a short time more.

When Vin<V1, the first diode LED1 and the second diode LED2 are both turned off. At this time, the first diode LED1 and the second diode LED2 don't light up, which shows the voltage Vin of the voltage source VIN is less than the minimum value of the warning voltage range, therefore the electronic device cannot work anymore.

According to the above working states of the first diode LED1 and the second diode LED2, the voltage detection circuit 100 can detect different voltage level of the voltage source VIN, which is very convenient.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A voltage detection circuit to determine whether a voltage provided by a voltage source is within a required voltage range, the voltage detection circuit comprising:
   a Zener diode comprising an anode and a cathode, wherein the cathode of the Zener diode is connected to the voltage source;
   a thyristor comprising a control terminal, an anode, and a cathode;
   a first resistor and a second resistor, wherein the anode of the Zener diode is connected to the control terminal of the thyristor through the first resistor, the anode of the thyristor is connected to the voltage source through the second resistor;
   a first light-emitting diode (LED) comprising an anode and a cathode, wherein the anode of the thyristor is connected to the anode of the first LED, the cathode of the thyristor is connected to the cathode of the first LED; and
   a second LED comprising an anode and a cathode, wherein the cathode of the thyristor is connected to the anode of the second LED, the cathode of the second LED is grounded;
   wherein when the voltage of the voltage source is greater than a breakdown voltage of the Zener diode, the thyristor is turned on, the second LED is turned on, and the first LED is turned off, to indicate the voltage of the voltage source exceeds a maximum value of the required voltage range.

2. The voltage detection circuit of claim 1, wherein the first and second LEDs respectively emit different-colored light.

3. The voltage detection circuit of claim 1, wherein a breakdown voltage of the Zener diode is greater than a sum of turn-on voltages of the first and second LEDs;
   wherein when the voltage of the voltage source is less than the breakdown voltage of the Zener diode, and greater than the sum of the turn-on voltages of the first and second LEDs, the thyristor is turned off, the first and second LEDs are turned on, to indicate the voltage of the voltage source is within the required voltage range;
   wherein when the voltage of the voltage source is less than the sum of the turn-on voltages of the first and second LEDs, and greater than the turn-on voltage of the first LED, the thyristor is turned off, the first LED is turned on, and the second LED is turned off, to indicate the voltage of the voltage source is less than a minimum value of the required voltage range but in a warning voltage range; and wherein when the voltage of the voltage source is less than the turn-on voltage of the first LED, the thyristor is turned off, the first and second LEDs are turned off, to indicate the voltage of the voltage source is below the warning voltage range.

* * * * *